(12) United States Patent
Henderson et al.

(10) Patent No.: US 9,184,130 B2
(45) Date of Patent: Nov. 10, 2015

(54) ELECTROSTATIC PROTECTION FOR STACKED MULTI-CHIP INTEGRATED CIRCUITS

(71) Applicant: QUALCOMM Incorporated, San Diego, CA (US)

(72) Inventors: Brian M. Henderson, San Diego, CA (US); Chiew-Guan Tan, San Diego, CA (US); Gregory A. Uvieghara, San Diego, CA (US); Reza Jalilizeinali, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 322 days.

(21) Appl. No.: 13/646,109

(22) Filed: Oct. 5, 2012

(65) Prior Publication Data

US 2014/0098448 A1 Apr. 10, 2014

(51) Int. Cl.
  *H02H 9/00* (2006.01)
  *H01L 23/525* (2006.01)
  *H01L 23/60* (2006.01)
  *H01L 25/065* (2006.01)
  *H01L 25/00* (2006.01)
  *H01L 23/31* (2006.01)
  *H01L 23/48* (2006.01)

(52) U.S. Cl.
  CPC ............ *H01L 23/5256* (2013.01); *H01L 23/60* (2013.01); *H01L 25/0657* (2013.01); *H01L 25/50* (2013.01); *H01L 23/3128* (2013.01); *H01L 23/481* (2013.01); *H01L 2224/16145* (2013.01); *H01L 2224/48091* (2013.01); *H01L 2224/73257* (2013.01); *H01L 2225/06513* (2013.01); *H01L 2225/06527* (2013.01); *H01L 2225/06541* (2013.01); *H01L 2225/06565* (2013.01)

(58) Field of Classification Search
  USPC .......................................................... 361/56
  See application file for complete search history.

(56) References Cited

U.S. PATENT DOCUMENTS

| | | | |
|---|---|---|---|
| 5,731,945 A | 3/1998 | Bertin et al. | |
| 6,243,283 B1 * | 6/2001 | Bertin et al. | 365/63 |
| 6,556,409 B1 | 4/2003 | Chittipeddi et al. | |

(Continued)

FOREIGN PATENT DOCUMENTS

| | | |
|---|---|---|
| JP | S5913354 A | 1/1984 |
| WO | 0147017 A1 | 6/2001 |

OTHER PUBLICATIONS

International Search Report and Written Opinion—PCT/US2013/063297—ISA/EPO—May 12, 2013.

*Primary Examiner* — Ronald W Leja
(74) *Attorney, Agent, or Firm* — Michelle S. Gallardo

(57) ABSTRACT

One feature pertains to a multi-chip module that comprises at least a first integrated circuit (IC) die and a second IC die. The second IC die has an input/output (I/O) node electrically coupled to the first IC die by a through substrate via. The second die's active surface also includes a fuse that is electrically coupled to the I/O node and adapted to protect the second IC die from damage caused by an electrostatic discharge (ESD). In particular, the fuse protects the second IC die from ESD that may be generated as a result of electrically coupling the first die to the second die during the manufacturing of the multi-chip module. Upon coupling the first die to the second die, the fuse may bypass the ESD current generated by the ESD to ground. After packaging of the multi-chip module is complete, the fuse may be blown open.

30 Claims, 12 Drawing Sheets

(56) References Cited

U.S. PATENT DOCUMENTS

| | | |
|---|---|---|
| 2003/0202309 A1 | 10/2003 | Miyaba |
| 2008/0055006 A1* | 3/2008 | Kim .......................... H03F 1/52 330/298 |
| 2009/0261906 A1* | 10/2009 | Kim .............................. 330/282 |
| 2009/0311841 A1* | 12/2009 | Bavisi et al. .................. 438/381 |
| 2014/0098448 A1* | 4/2014 | Henderson .......... H01L 23/5256 361/56 |

\* cited by examiner

| Fuse # | ESD Event: Remain Closed | | | Fuse-blow State: Blow Open | | |
|---|---|---|---|---|---|---|
| | Current | Time | Total Q | Current | Time | Total Q |
| Fuse A | 1 µA - 1 A | 1 ps - 10 ns | 1 aC - 10 nC | 1 mA - 500 mA | 50 µs - 10 ms | 50 nC - 5 mC |
| Fuse B | 1 µA - 1 A | 1 ps - 10 ns | 1 aC - 10 nC | 5 mA - 500 mA | 10 µs - 10 ms | 50 nC - 5 mC |
| Fuse C | 1 µA - 1 A | 1 ps - 10 ns | 1 aC - 10 nC | 10 mA - 500 mA | 5 µs - 10 ms | 50 nC - 5 mC |
| Fuse D | 1 µA - 10 A | 1 ps - 1 ns | 1 aC - 10 nC | 1 mA - 500 mA | 50 µs - 10 ms | 50 nC - 5 mC |
| Fuse E | 1 µA - 10 A | 1 ps - 1 ns | 1 aC - 10 nC | 5 mA - 500 mA | 10 µs - 10 ms | 50 nC - 5 mC |
| Fuse F | 1 µA - 10 A | 1 ps - 1 ns | 1 aC - 10 nC | 10 mA - 500 mA | 5 µs - 10 ms | 50 nC - 5 mC |
| Fuse G | 1 µA - 0.1A | 1 ps - 100 ns | 1 aC - 10 nC | 1 mA - 500 mA | 50 µs - 10 ms | 50 nC - 5 mC |
| Fuse H | 1 µA - 0.1A | 1 ps - 100 ns | 1 aC - 10 nC | 5 mA - 500 mA | 10 µs - 10 ms | 50 nC - 5 mC |
| Fuse I | 1 µA - 0.1A | 1 ps - 100 ns | 1 aC - 10 nC | 10 mA - 500 mA | 5 µs - 10 ms | 50 nC - 5 mC |

*FIG. 8*

ELECTROSTATIC PROTECTION FOR STACKED MULTI-CHIP INTEGRATED CIRCUITS

BACKGROUND

1. Field

Various features relate to integrated circuits (ICs), and more particular/to electrostatic protection for stacked multi-chip integrated circuits.

2. Background

The ever increasing demand for smaller, lighter, and faster portable electronic devices, such as mobile phones and laptop computers, has encouraged the electronics industry to create circuit components having greater capacity, performance, and smaller dimensions. For example, portable devices may now contain integrated circuit (IC) packages having two or more semiconductor dies stacked vertically and encased within the same molding compound of the IC package. Such multi-chip IC packages may be commonly referred to as "chip stack multi-chip modules" (MCM). According to one technique called "through silicon stacking" (TSS), the vertically stacked multiple semiconductor dies are electrically coupled to one another using through substrate vias (TSVs). TSVs are electrical conductors typically made of metal that pass vertically through the thickness of a die's substrate such that one end is exposed at a back side surface of the die substrate, and another, opposite end is electrically coupled to the active surface of the die.

FIG. 1 illustrates, a schematic, cross-sectional side view of a TSS MCM 100 found in the prior art. The MCM 100 includes a plurality of semiconductor dies 102a, 102b, 102c that are electrically coupled to one another using TSVs 104a, 104b, 104c. The top die 102a has an active surface 106a that includes a plurality of integrated circuit components (e.g., transistors, capacitors, inductors, resistors, etc.), and a back side surface 108a. The TSV 104a is electrically coupled to the active surface 106a and runs through the thickness of the die's 102a substrate. Similarly, the middle and bottom dies 102b, 102c each have active surfaces 106b, 106c and back side surfaces 108b, 108c. The middle die's TSV 104b is electrically coupled to the middle die's active surface 106b, and the bottom die's TSV 104c is electrically coupled to the bottom die's active surface 106c.

The TSVs 104a, 104b, 104c have contact pads 110a, 110b, 110c at one end and contact pad receivers 105a, 105b, 105c at an opposite end. Each dies' active surface 106a, 106b, 106c may be electrically coupled to its respective TSV 104a, 104b, 104c. The contact pads 110a, 110b, 110c are exposed at the dies' front side active surfaces 106a, 106b, 106c, and the contact pad receivers 105a, 105b, 105c are exposed at the dies' back side surfaces 108a, 108b, 108c. The contact pads 110a, 110b, 110c are metal "microbumps" and the contact pad receivers 105, 105b, 105c may be metal indentations on the dies that have a corresponding curvature to receive and mate to the microbumps 110a, 110b, 110c.

The top die's contact pad 110a is physically and electrically coupled to the middle die's contact pad receiver 105b, and the middle die's contact pad 110b is physically and electrically coupled to the bottom die's contact pad receiver 105c. In this fashion, the dies' active surfaces 106a, 106b, 106c, are electrically coupled to one another through the vias 104a, 104b, 104c.

The bottom die 102c is physically and electrically coupled in a flip chip fashion to a package substrate 112 (e.g., laminate substrate, metal based substrate, such as copper based substrate, etc.) with an underfill and/or epoxy 115. The package substrate 112 may include multiple layers having a plurality of interconnections (not shown) there between. The interconnections in turn may be electrically coupled to a plurality of soldering balls 114 that form a ball grid array (BGA) that the MCM 100 uses to electrically couple to a printed circuit board (not shown). The components of the MCM 100, including the dies 102a, 102b, 102c, the TSVs 104a, 104b, 104c, and at least a portion of the substrate 112 may be encased in a molding compound 116.

FIG. 2 illustrates the process of electrically and physically coupling the top die 102a to the middle die 102b during manufacturing of the MCM 100. In the illustrated example, the molding compound 116 (See FIG. 1) has been removed to show how the top die 102a is placed onto the middle die 102b (the three directional arrows in FIG. 2 illustrate the motion of the top die 102a toward the middle die 102b). During this process, the top die 102a is moved close to the middle die 102b, and stacked on top such that the contact pad 110a of the top die 102a mates with the contact pad receiver 105b of the middle die 102b. However, sometimes the top die 102a may have an electrostatic potential that is substantially different (e.g. much greater or much less) than the middle die 102b, which may be grounded. When the two dies 102a, 102b get sufficiently close (e.g., upon contact), an electrostatic discharge (ESD) event (i.e., static electricity) may be triggered such that a relatively large amount of current momentarily flows through the TSV 104b of the middle die 102b. Without proper ESD protection circuitry, sensitive IC components (such as buffer circuit transistors) located on the middle die's active surface 106b that are electrically coupled to the TSV 104b may be damaged from the ESD event. In some cases, circuitry located on the active surface 106a of the top die 102a may also be damaged. Similarly, other dies within the MCM 100 are also prone to such ESD harm, including the bottom die 102c when the middle die 102b is electrically and physically coupled to the bottom die 102c.

FIG. 3 illustrates a schematic of an ESD protection circuit 300 found in the prior art that may be coupled to the middle die's TSV 104b to protect the middle die's 102b circuitry 310 from ESD damage. The ESD protection circuit 300 features diodes 302, 304 that form a shunt which bypasses the ESD current away from the sensitive circuitry 310, which may be, for example, an output signal buffer.

Although the ESD protection circuit 300 may be effective in protecting the output signal buffer 310 from ESD damage, the ESD protection circuit 300 has notable disadvantages. For example, the diodes 302, 304 may occupy significant silicon/die area due to their relatively large size that is needed to accommodate the high ESD current flow. Moreover, the diodes 302, 304 create parasitic effects at the TSV 104b output node 306, including parasitic capacitance and/or inductance. To compensate for these parasitic effects, the buffer 310 size may have to be larger so that it can sufficiently drive the output signal at the output node 306. A larger buffer 310 consumes more power and also takes up more active silicon/die area. Therefore, the silicon/die area devoted to the ESD protection circuitry 300 directly (e.g., diode 302, 304 component area) and indirectly (e.g., larger buffer 310) uses active surface area that may otherwise be used for other IC components.

Thus, there is a need for advanced ESD protection circuits that adequately protect dies of an MCM without suffering from the aforementioned size and power consumption issues.

SUMMARY

One feature provides a multi-chip module, comprising a first integrated circuit (IC) die, a second IC die having an input/output (I/O) node electrically coupled to the first IC die by a through substrate via (TSV), and a fuse on an active surface of the second IC die that is electrically coupled to the I/O node, where the fuse is adapted to protect the second IC die from damage caused by an electrostatic discharge (ESD). According to one aspect, the fuse is adapted to protect the second IC die from damage caused by the ESD occurring in response to electrically coupling the first IC die to the second IC die. According to another aspect, the fuse includes a first terminal and a second terminal, where the first terminal is coupled to the I/O node and the second terminal is coupled to ground. According to yet another aspect, the fuse provides a short circuit path from the I/O node to ground if the fuse is in a closed state, and the fuse electrically disconnects the I/O node from ground if the fuse is in an open state.

According to one aspect, the multi-chip module further comprises an amplifier circuit having at least one of an amplifier input terminal and/or an amplifier output terminal that is electrically coupled to the I/O node. The fuse may be adapted to protect the amplifier circuit from damage caused by the ESD. According to one aspect, the amplifier circuit generates a fuse-blow current that transitions the fuse from a closed state to an open state. According to another aspect, the fuse transitions from the closed state to the open state in response to the fuse-blow current having parameters of 1 milliamp (mA) to 100 mA lasting 50 microseconds (μs) to 200 μs, 5 mA to 100 mA lasting 10 μs to 200 μs, or 10 mA to 100 mA lasting 10 μs to 200 μs. According to one aspect, a fuse-blow circuit is electrically coupled to the I/O node that generates a fuse-blow current that transitions the fuse from a closed state to an open state. According to another aspect, the fuse remains in a closed state in response to a current surge at the I/O node generated by the ESD, and transitions to an open state in response to a fuse-blow current generated by an amplifier circuit or a fuse-blow circuit.

According to one aspect, the fuse is part of an ESD protection circuit that is free of diodes. According to another aspect, the fuse is a metal fuse or a poly-silicon fuse. The fuse may provide a resistance greater than or equal to ten (10) megaohms between the I/O node and ground if the fuse is in an open state. According to one example, the multi-chip module may be incorporated into at least one of a music player, a video player, an entertainment unit, a navigation device, a communications device, a mobile phone, a smartphone, a personal digital assistant, a fixed location terminal, a tablet computer, and/or a laptop computer.

Another feature provides a method of manufacturing a multi-chip module that comprises providing a first IC die, providing a second IC die, providing a through substrate via (TSV) that electrically couples an I/O node of the second IC die to the first IC die, forming a fuse on an active surface of the second IC die, and electrically coupling the fuse to the I/O node, where the fuse is adapted to protect the second IC die from damage caused by an ESD. According to one aspect, the method further comprises coupling a first terminal of the fuse to the I/O node, and coupling a second terminal of the fuse to ground. According to another aspect, the method further comprises providing a short circuit path from the I/O node to ground by maintaining the fuse in a closed state. According to yet another aspect, the method further comprises electrically disconnecting the I/O node from ground by transitioning the fuse from a closed state to an open state. According to yet another aspect, the method further comprises electrically coupling at least one of an amplifier output terminal and/or an amplifier input terminal of an amplifier circuit to the I/O node. According to yet another aspect, the method further comprises generating a fuse-blow current at the amplifier circuit that transitions the fuse from a closed state to an open state. According to yet another aspect, the method further comprises maintaining the fuse in a closed state in response to a current surge at the I/O node generated by the ESD, and transitioning the fuse to an open state in response to a fuse-blow current generated by an amplifier circuit or a fuse-blow circuit.

Another feature provides a multi-chip module comprising a first IC die, a second IC die having an I/O node, a means for electrically coupling the I/O node of the second IC die to the first IC die, and a means for protecting the second IC die from damage caused by an electrostatic discharge (ESD), where the means for protecting the second IC die is located on an active surface of the second IC die. According to one aspect, the means for protecting the second IC die is adapted to protect the second IC die from damage caused by the ESD occurring in response to electrically coupling the first IC die to the second IC die. According to another aspect, the means for protecting the second IC die is a fuse having a first terminal and a second terminal, where the first terminal is coupled to the I/O node and the second terminal is coupled to ground. According to yet another aspect, the fuse remains in a closed state in response to a current surge at the I/O node generated by the ESD, and transitions to an open state in response to a fuse-blow current generated by an amplifier circuit or a fuse-blow circuit. According to yet another aspect, the fuse is adapted to protect an ESD-sensitive circuit from damage caused by the ESD. The ESD-sensitive circuit may generate a fuse-blow current that transitions the fuse from a closed state to an open state.

BRIEF DESCRIPTION OF THE DRAWINGS

FIG. 8 illustrates a table of fuses having characteristics associated with transitioning the fuse from a closed state to an open state given various amounts of current flow for various periods of time.

DETAILED DESCRIPTION

Figure 1:
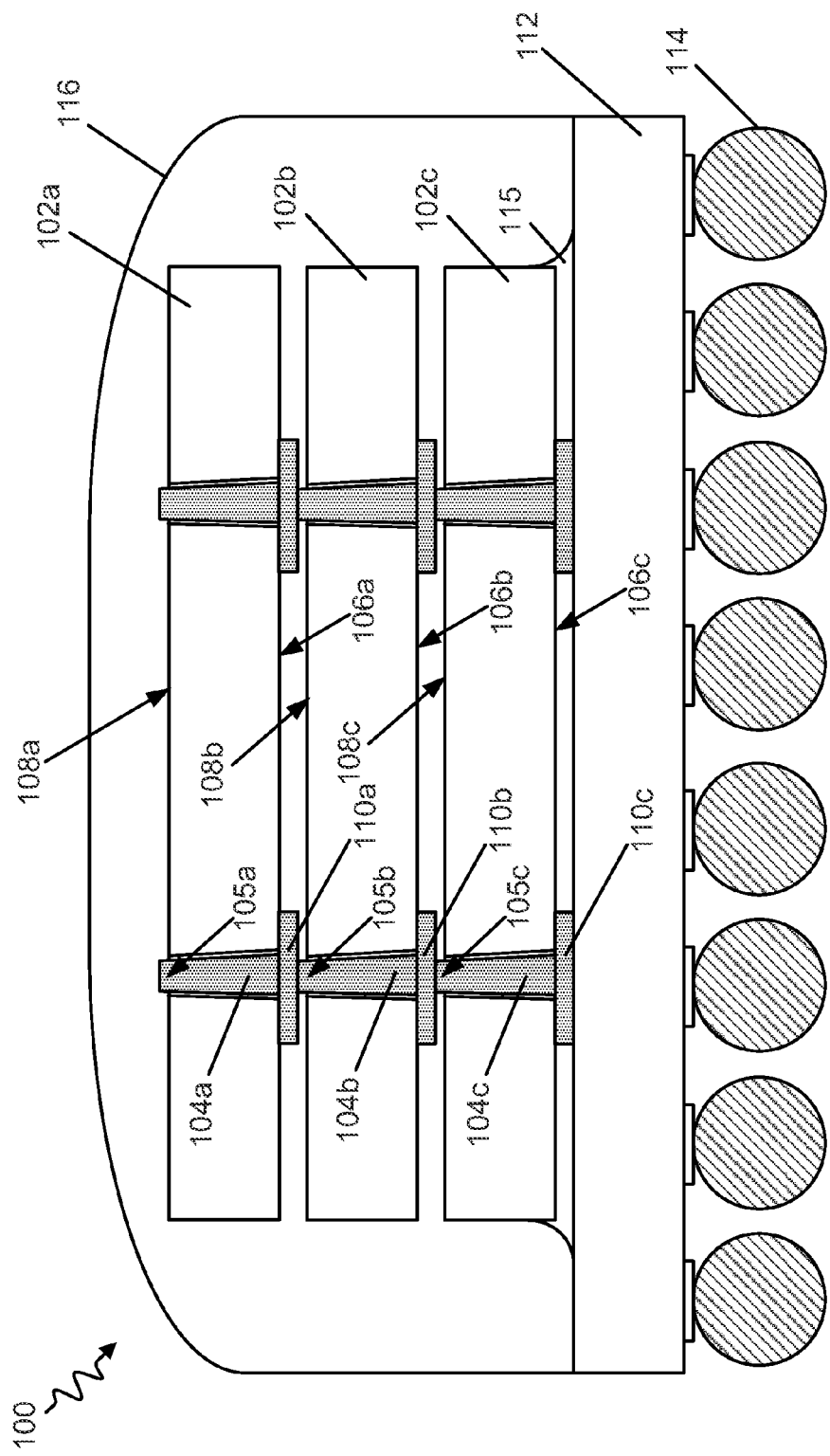
FIG. 1 illustrates a schematic, cross-sectional side view of a through silicon stacking (TSS) multi-chip module (MCM) found in the prior art.
Figure 2:
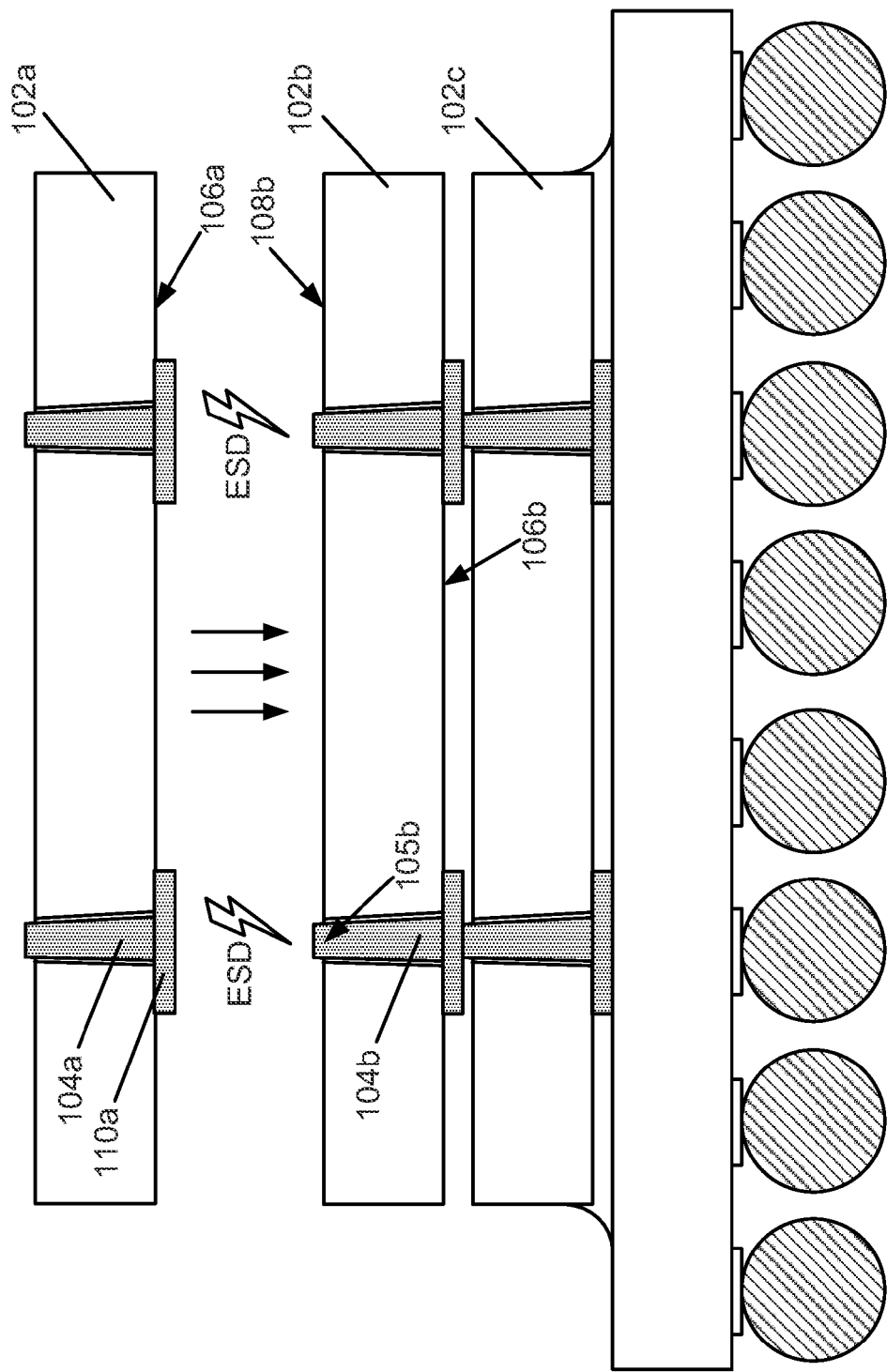
FIG. 2 illustrates the process of electrically and physically coupling the top die to the middle die during manufacturing of the MCM found in the prior art.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. As used herein, the term "electrically coupled" is used herein to refer to the direct or indirect coupling between two objects that allows for the flow of electrical current to take place between the two objects. For example, if object A physically touches object B, and object B physically touches object C, then objects A and C may still be considered electrically coupled to one another—even if they do not directly physically touch each other—if object B is a conductor that allows for the flow of electrical current to take place from object A to object C and/or from object C to object A. As used herein, the term "input/output node" and "I/O node" refers to an input and/or output circuit terminal of the circuit and/or die. Thus, an I/O node may act as either an output terminal or an input terminal, or both an input and an output terminal of the circuit and/or die. As used herein, the term "via" is a "vertical interconnect access," which is a vertical electrical connection between different layers of conductors in a physical electronic circuit, and may also be a vertical electrical connection between different IC dies in an MCM.

Overview

A method and apparatus for protecting ESD-sensitive circuitry on multi-chip module (MCM) dies from ESD events is provided. For example, one feature pertains to a multi-chip module that comprises a first IC die and a second IC die. The second IC die has an I/O node electrically coupled to the first IC die by a through substrate via. The second die's active surface also includes a fuse that is electrically coupled to the I/O node and is adapted to protect the second IC die from damage caused by an ESD event. In particular, the fuse protects the second IC die from an ESD event that may be generated as a result of electrically coupling the first die to the second die during the manufacturing of the multi-chip module. Upon coupling the first die to the second die, the fuse may bypass the ESD current generated by the ESD to ground. After packaging of the multi-chip module is complete, the fuse may be blown open.

Utilizing an ESD protection circuit having a fuse as described herein is advantageous because, among other things, it may significantly reduce the active surface area needed to protect a die from ESD as compared with prior art solutions. For example, the fuse may occupy less active surface area on the die than diodes associated with prior art ESD protection circuits. Moreover, eliminating the need for large diode based ESD protection circuitry by instead using the ESD protection circuitry described herein may further save active surface area because any input and/or output buffer circuits used to drive or driven by I/O nodes coupled to the novel ESD protection circuitry may themselves be designed smaller. For example, a fuse occupying a smaller area than diodes may reduce parasitic effects at the I/O nodes, which in turn allows smaller I/O buffer circuits to drive the I/O nodes.

ESD Protection Circuitry

Figure 4:
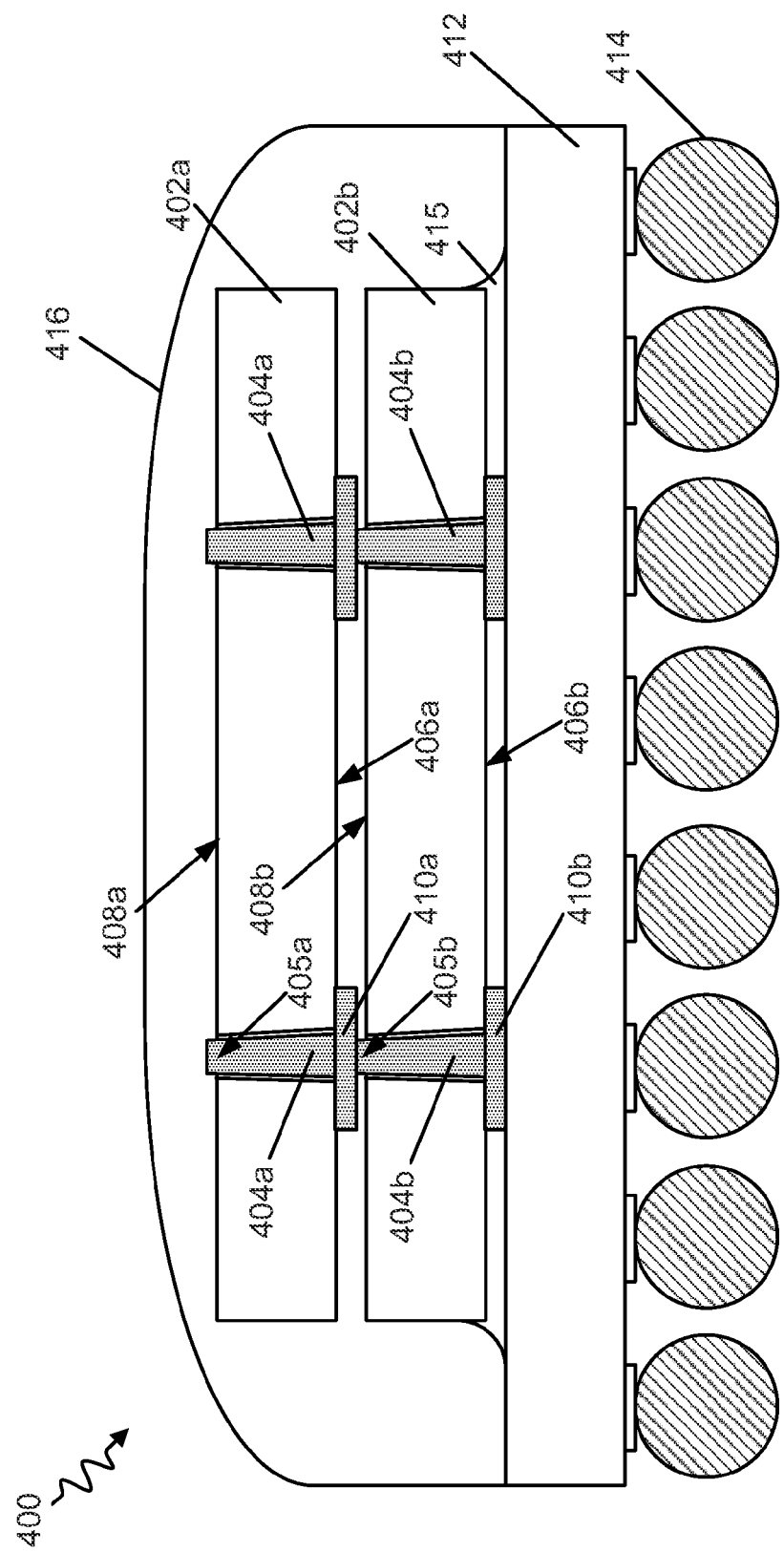
FIG. 4 illustrates a schematic, cross-sectional side view of a stacked MCM featuring ESD protection circuitry.

FIG. 4 illustrates a schematic, cross-sectional side view of a stacked multi-chip module (MCM) 400 featuring ESD protection circuitry according to one aspect of the disclosure. The MCM 400 includes a first semiconductor die 402a and a second semiconductor 402b that are both electrically coupled to one another using one or more conductive TSVs 404a, 404b. The first die 402a has an active surface 406a that includes a plurality of integrated circuit components (e.g., transistors, capacitors, inductors, resistors, etc.), and a back side surface 408a. The TVs 404a are electrically coupled to the first die's active surface 406a and pass through the thickness of the first die 402a (e.g., through the thickness of the first die's 402a substrate). Similarly, the second semiconductor die 402b has an active surface 406b and a back side surface 408b. The second die's TSV 404b is electrically coupled to the second die's active surface 406b and passes through the thickness of the second die's 402b substrate. For example, the first die's TSVs 404a may be electrically coupled to input/output nodes associated with the first die 402a, and the second die's TSVs 404b may be electrically coupled to input/output nodes associated with the second die 402b. These input/output nodes act as input and/or output terminals of the dies 402a, 402b.

The TSVs 404a, 404b have contact pads 410a, 410b at one end and contact pad receivers 405a, 105b at an opposite end. Each dies' active surface 106a, 406b may be electrically coupled to its respective TSVs 404a, 404b. The contact pads 410a, 410b are exposed at the dies' front side active surfaces 406a, 406b, and the contact pad receivers 405a, 405b are exposed at the dies' back side surfaces 408a, 408b. In one aspect, the contact pads 410a, 410b may be metal "microbumps" and the contact pad receivers 405a, 405b may be metal indentations on the dies that have a corresponding curvature to receive and mate to the microbumps. Generally however, the contact pads 410a, 410b and the corresponding contact pad receivers 405a, 405b are electrical conductors adapted to mate with one another and electrically couple the dies 402a, 402b to each other.

The first die's contact pads 410a are physically and electrically coupled to the second die's contact pad receivers 105b, in this fashion, the dies' active surfaces 106a, 406b are electrically coupled to one another through the TSVs 404a, 404b.

The second die 402b is physically and electrically coupled in a flip chip fashion to package substrate 412 (e.g., laminate substrate, metal based substrate, such as copper based substrate, etc.) with an underfill and/or epoxy 415. The package substrate 412 may include multiple layers having a plurality of interconnections (not shown) there between. The interconnections in turn may be electrically coupled to a plurality of soldering balls 114 that form a ball grid array (BOA) that is used to electrically couple the MCM 400 to a printed circuit board (not shown). The components of the MCM 400, including the dies 402a, 402b, the TSVs 404a, 404b, and at least a portion of the substrate 412 may be encased in a molding compound 416. Although the MCM 400 shown has two dies 102a, 402b, the MCM 400 may have any number of dies equal to or greater than two that are stacked on top of each other and electrically coupled to one another using TSVs having contact pads and contact pad receivers similar to those described above with respect to the first and second dies 402a, 402b.

Figure 5:
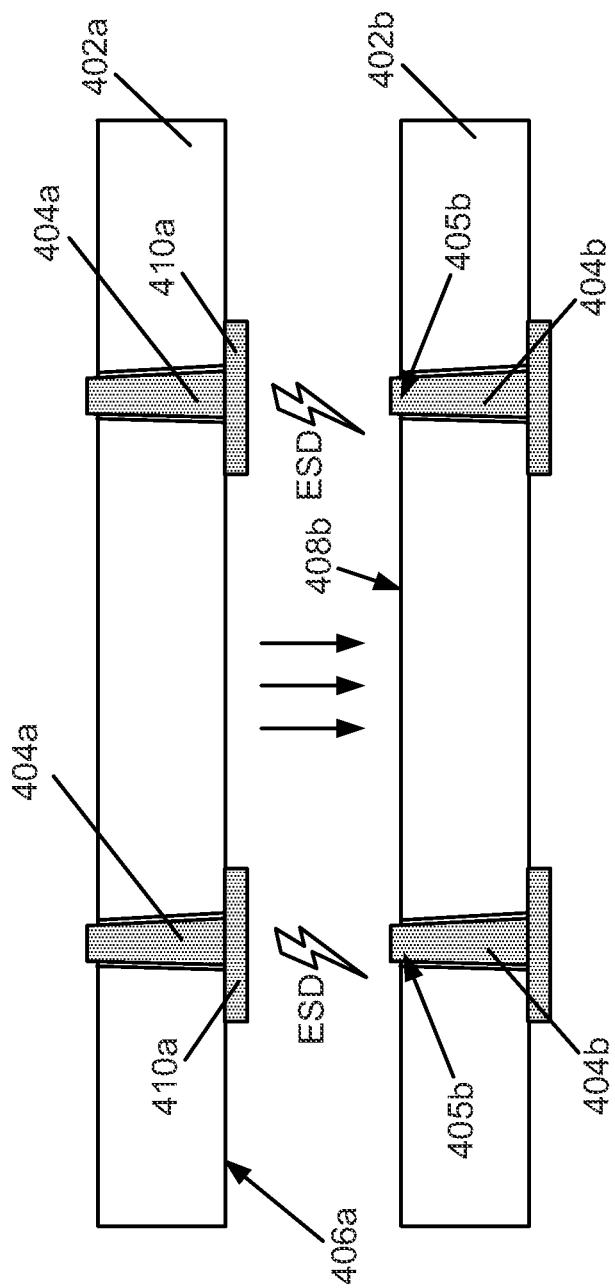
FIG. 5 illustrates the process of electrically and physically coupling the first die to the second die (see directional arrows) during manufacturing of the MCM.

FIG. 5 illustrates the process of electrically and physically coupling the first die 402a to the second die 402b (see directional arrows) during manufacturing of the MCM 400. (The package substrate 412, the soldering balls 414, and the molding compound 416 have been omitted for clarity.) During this process, the first die 402a is moved closer to the second die 402b, and stacked on top such that the contact pads 410a of the first die 402a physically and electrically couple to the contact pad receivers 405b of the second die 402b. In some cases, the first die 402a may have an electrostatic potential that is substantially different (e.g., much greater or much less) than the second die 402b, which may be grounded. When the two dies 402a, 402b get sufficiently close (e.g., upon contact), an electrostatic discharge (ESD) event (e.g., static electricity) may occur and a relatively large amount of current momentarily flows through TSV 404b of the second die 402b. As described below, ESD protection circuits are electrically coupled to the TSVs 404b to protect sensitive circuitry at the input/output nodes of the second die 402b from ESD events.

Figure 6:
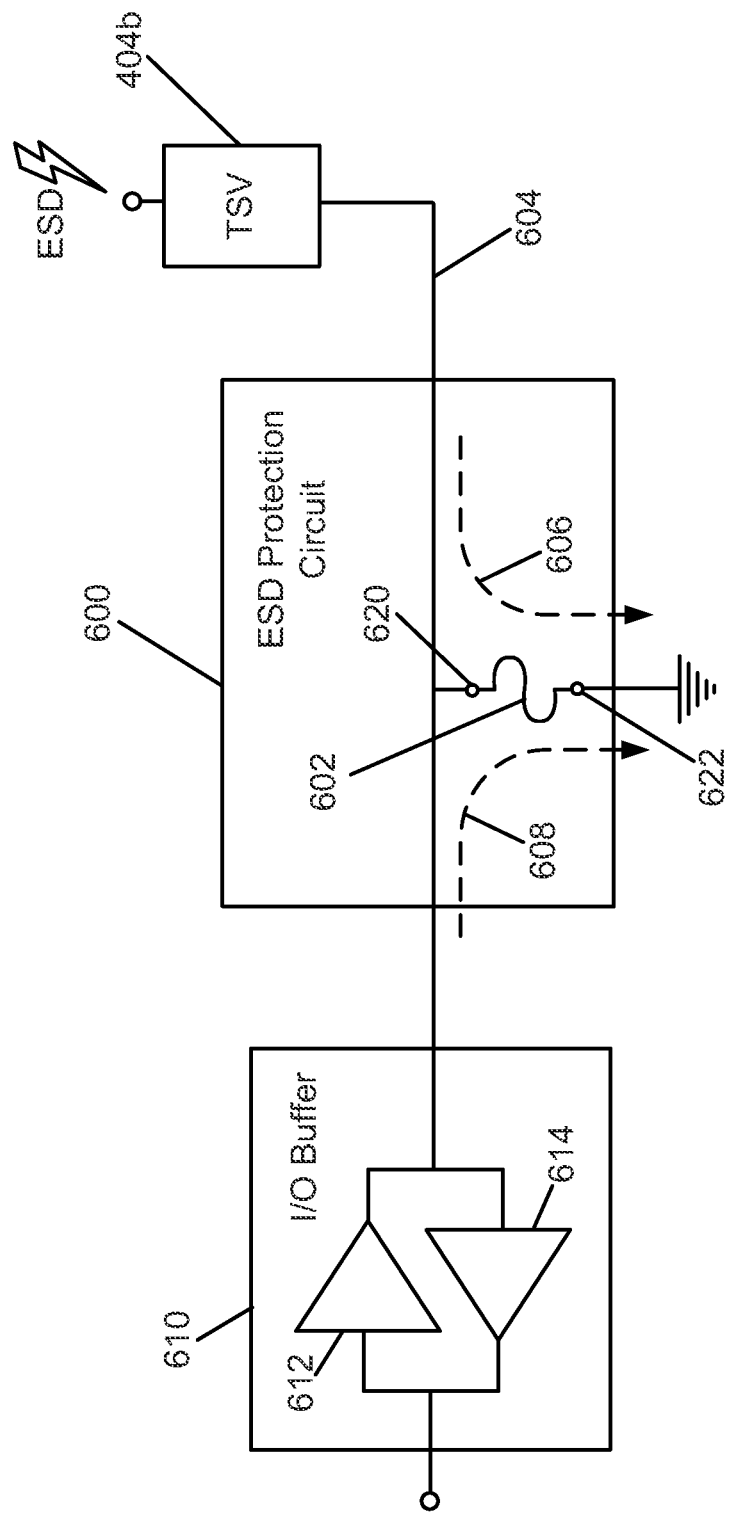
FIG. 6 illustrates a schematic of an ESD protection circuit that protects the MCM's dies from ESD damage.

FIG. 6 illustrates a schematic of an ESD protection circuit 600 that protects the MCM's dies from ESD damage according to one aspect of the disclosure. Referring to FIGS. 4-6, the ESD circuit 600 is electrically coupled to one of the second die's TSVs 404b. Each TSV 404b of the second die 402b may be electrically coupled to one or more input/output (I/O) nodes 604 associated with the second die 402b. Each I/O node 604 acts as an input and/or output terminal of the die 402b. The node 604 is electrically coupled to the ESD circuit 600 and may also be electrically coupled to an I/O signal buffer circuit 610 (also referred to herein as an "amplifier circuit").

The I/O signal buffer circuit 610 may include one or more output amplifiers 612 that may process (e.g., amplify) and provide output signals to the I/O node 604. These output signals may then be provided to other points in the MCM 400, including input nodes of the first die 402a. Alternatively, or in addition to, the I/O signal buffer circuit 610 may include one or more input amplifiers 614 that receive input signals from the I/O node 604. These input signals may then be processed (e.g., amplified) and provided by the I/O signal buffer circuit 610 to other circuit components of the second die 402b. Thus, the amplifier circuit 610 may have at least one of an amplifier input terminal and/or an amplifier output terminal electrically coupled to the I/O node 604.

The specific design of the amplifiers 612, 614 used depends on the application of the MCM 400, and may be selected by one of ordinary skill in the art. However, notwithstanding the specific design of the I/O buffer circuit 610, the circuit 610 may include sensitive circuit components that can be readily damaged by ESD events at the I/O node 604, such as, but not limited to, the input and/or output amplifiers 612, 614. Moreover, other ESD-sensitive circuits in addition to or instead of the I/O buffer circuit 610 may be electrically coupled to the I/O node 604 that are also prone to ESD damage. ESD events may be caused by the processes described above with respect to FIG. 5. That is, electrically coupling another semiconductor die (e.g., first die 402a) to the second die 402b may cause an ESD event at the I/O node 604 through the TSV 404b.

The ESD protection circuit 600 includes a fuse 602. A fuse is typically a two terminal element that ideally has zero resistance and acts like a short circuit between its terminals when it is operating in a "closed state" (may also be referred herein as an "unblown state," and a "short circuit state"). By contrast, a fuse ideally has infinite resistance and acts like an open circuit between its terminals when it is operating in an "open state" (may also be referred herein as a "blown state," and an "open circuit state"). A fuse transitions from a closed state to an open state (i.e., the fuse is "blown open") when more than a predetermined amount of charge passes through its two terminals for a predetermined period of time. For example, a fuse may be designed to transition from a closed state to an open state if a current exceeding one ampere passes through it for more than 20 milliseconds.

The fuse 602 illustrated in FIG. 6 is an integrated circuit component formed on the active surface 406b of the second die 402b. A first terminal 620 of the fuse 602 is coupled to the I/O node 604 while a second terminal 622 of the fuse 602 is coupled to ground. In its initial state the fuse 602 is in a closed, short circuit state so that a low resistance, short circuit path exists between the I/O node 604 and ground. Then, if an ESD event is triggered upon electrically coupling the first die 402a to the second die 402b such that a surge of current (shown as the curved, dashed directional arrow 606) passes through the TSV 404b and I/O node 604, the fuse 602 allows the ESD current 606 surge to go directly to ground thereby bypassing the I/O buffer circuit 610 and/or other sensitive circuitry electrically coupled to the I/O node 604. Thus, the closed state (i.e., short circuit state) of the fuse 602 protects the buffer circuit 610 and/or other sensitive circuitry electrically coupled to the I/O node 604 from ESD damage that may be caused when the first die 402a is electrically coupled to the second die 402b.

The fuse 602 may be a metal fuse, such as copper, aluminum, metal alloy, or other metal materials. The fuse 602 may also be a polysilicon fuse (i.e., polyfuse). Of course, the fuse 602 is not limited to being composed of these materials, and other materials or combinations thereof may also be used to construct the fuse 602. In one aspect of the disclosure, a plurality of TSVs on a plurality of dies of an MCM may each be electrically coupled to a separate ESD protection circuit 600 in the manner shown in FIG. 6 so that each I/O node of the dies is protected from ESD damage during manufacture of the MCM. This includes, but is not limited to, ESD damage that may result from manufacturing steps that include electrically coupling two dies of an MCM together.

Once the first die 402a is electrically and physically coupled to the second die 402b, the MCM 400 may be encapsulated with the molding compound 416. However, if the fuse 602 remains in a closed state it may undesirably alter the operation of the I/O buffer circuit 610. For example, in such a case the I/O node 604 would remain electrically coupled to ground, and thus, regardless of the output signal provided and/or the input signal received by the I/O buffer circuit 610, the signal level at the I/O node 604 would be ground. Therefore, before normal operation of the MCM 400 may begin, the fuse 602 should undergo a "fuse-blow state" where the fuse 602 is purposely blown open if it hasn't been already blown open by an ESD event itself. According to one aspect, when the MCM 400 enters the fuse-blow state, the I/O buffer circuit 610 generates current flow (shown as the curved, dashed directional arrow 608) through the fuse 602 that is sufficiently large enough and maintained long enough to blow the fuse 602. Once the fuse 602 is blown into an open circuit state, normal operation of the MCM 400 (i.e., the I/O buffer circuit 610 may provide output signals and/or receive input signals at the I/O node 604) may commence because the I/O node 604 is no longer electrically coupled to ground.

Figure 7:
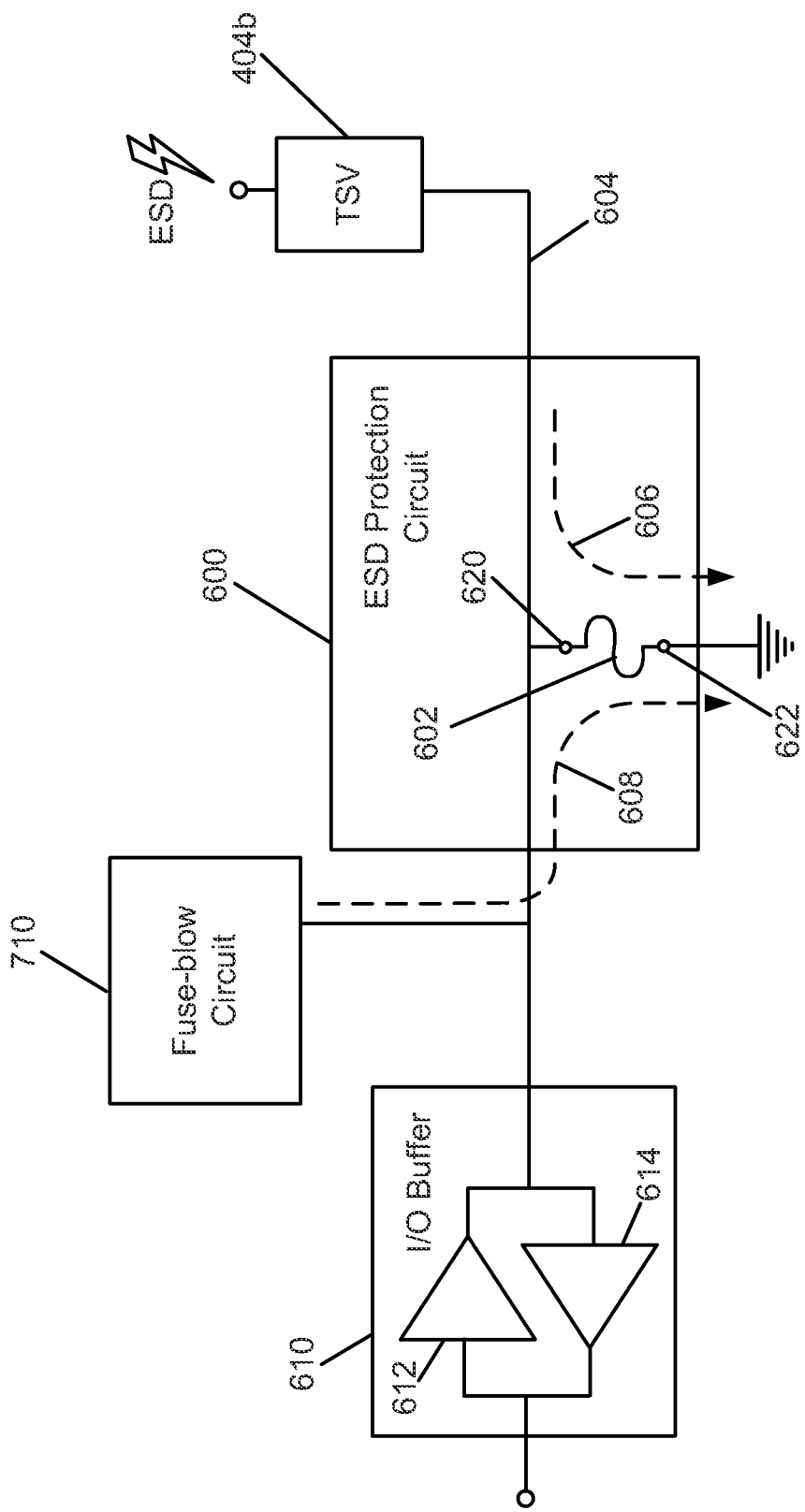
FIG. 7 illustrates a schematic of the ESD protection circuit that is also electrically coupled to a fuse-blow circuit.

FIG. 7 illustrates a schematic of the ESD protection circuit 600 that is also electrically coupled to a fuse-blow circuit 710 according to one aspect of the disclosure. The fuse-blow circuit 710 may include amplifier circuitry transistors) that is adapted to generate the fuse-blow current 608. In the example shown, the fuse-blow circuit 710 is shown as a separate circuit from the I/O buffer circuit 610. Thus, whereas the I/O buffer circuit 610 in FIG. 6 may double as an output signal generator for the I/O node 604 and also a fuse-blow circuit adapted to generate current 608 sufficient to blow the fuse 602, the fuse-blow circuit 710 in FIG. 7 may be a distinct circuit separate from the buffer 610.

According to one aspect of the disclosure, the fuse 602 is designed and selected such that a current 606 generated by a typical ESD event (e.g., electrically coupling the first die 402a to the second die 402b) does not blow the fuse 602, but the fuse 602 does blow in response to a fuse-blow current 608 generated by the buffer circuit and/or the fuse-blow circuit 710. Typically, ESD events generate relatively high current levels for very short durations of time, which may result in a total charge flow that is below the threshold necessary to blow the fuse 602. By contrast, the fuse-blow current 608 generated by the buffer circuit 610 and/or fuse-blow circuit 710 may be a relatively moderate current flow that is sustained for a relatively tong period of time, which results in a total charge flow that is sufficient to blow the fuse 602. For example, the total charge flow generated by the fuse-blow current 608 may be orders of magnitude greater than the total charge flow generated by the ESD event.

FIG. 8 illustrates a table 800 of fuses having characteristics associated with transitioning the fuse 602 from a closed state to an open state given various amounts of current flow for various periods of time. The fuse 602 shown in FIGS. 6 and 7 may have any one of the characteristics of the fuses A, B, C, D, F, F, G, H, and I shown in the table 800. Referring to FIG. 8, Fuse A may remain closed in response to an ESD event current that ranges from 1 microamp (μA) to 1 ampere (A) lasting 1 picosecond (ps) to 10 nanoseconds (ns). These values result in a total charge ranging from 1 atto-Coulomb (aC) to 10 nano-Coulombs (nC) flowing through Fuse A. By contrast, Fuse A may blow open (i.e., transition into an open state) in response to a fuse-blow current generated by the I/O buffer circuit 610 and/or fuse-blow circuit 710 that ranges from 1 milliamp (mA) to 500 mA lasting 50 microseconds (μs) to 10 milliseconds (ms). These values result in a total charge ranging from 50 nC to 5 milli-Coulombs (mC) flowing through Fuse A. Fuses B and C may also remain closed in response to an ESD event current that ranges from 1 μA to 1 A lasting 1 ps to 10 ns, which results in a total charge flow ranging from 1 aC to 10 nC. However, Fuse B may blow open in response to a fuse-blow current that ranges from 5 mA to 500 mA lasting 10 μs to 10 ms, while Fuse C may blow open in response to a fuse-blow current that ranges from 10 mA to 500 mA lasting 5 μs to 10 ms. These values result in a total charge ranging from 50 nC to 5 mC flowing through Fuses B and C.

Fuses D, E, and remain closed in response to an ESD event current that ranges from 1 μA to 10 A lasting 1 ps to 1 ns, which results in a total charge flow ranging from 1 aC to 10 nC. However, Fuses D, E, and F may blow open in response to a fuse-blow current that ranges from 1 mA to 500 mA lasting 50 μs to 10 ms, 5 mA to 500 mA lasting 10 μs to 10 ms, and 10 mA to 500 mA lasting 5 μs to 10 ms, respectively. These values result in a total charge ranging from 50 nC to 5 mC flowing through Fuses D, E, and F. Fuses G, H, and I remain closed in response to an ESD event current that ranges from 1 μA to 0.1 A lasting 1 ps to 100 ns, which results in a total charge flow ranging from 1 aC to 10 nC. However, Fuses G, H, and I may blow open in response to a fuse-blow current that ranges from 1 mA to 500 mA lasting 50 us to 10 ms, 5 mA to 500 mA lasting 10 μs to 10 ms, and 10 mA to 500 mA lasting 5 μs to 10 ms, respectively. These values result in a total charge ranging from 50 nC to 5 mC flowing through Fuses G, H, and I.

In the examples given above, the fuse 602 may not blow open during an ESD event but may blow open after the fuse-blow current generated by the I/O buffer circuit 610 and/or fuse-blow circuit 710 generates the current flow conditions that are sufficient to transition the fuse 602 from a closed state to an open state. Thus, the fuse 602 may be designed such that it can withstand current surges that may be typical of an ESD event, such as one that may be triggered when electrically coupling the first die 402a to the second die 402b of the MCM 400.

However, in some cases the ESD current surge itself may nevertheless cause the fuse 602 to blow open during the ESD event. In this case, the MCM 400 may still be protected from the ESD event, and also function normally later during standard operation. For example, although the ESD current surge may cause the fuse 602 to blow open, a sufficient amount of the current may have already bypassed ESD sensitive circuitry, such as the I/O buffer circuit 610, so that these sensitive circuits are still not harmed by the ESD event. Moreover, after manufacturing of the MCM 400 is complete (i.e., it has been encapsulated with the molding compound 416, etc.), the MCM 400 can be tested to see if the one or more fuses 602 in the MCM are in an open state or a closed state. That is, once manufacturing of the MCM 400 is complete, the I/O nodes 604 may be directly or indirectly tested to see if they are shorted to ground (i.e., the fuse 602 is still in a closed state). Those fuses 602 that are still in a closed state may need to be programmed open by finning a fuse-blow current through them using the I/O buffer circuits 610 and/or fuse-blow circuits 710 described above. However, those fuses 602 that have already blown open due to the ESD event itself do not need to be programmed open using the I/O buffer circuits 610 and/or fuse-blow circuits 710 since they are already in an open state. Once the fuses 602 have transitioned into an open state, whether by the ESD event itself or fuse-blow current programming, the I/O buffer circuits 610 may operate normally (i.e., provide an output signal or receive an input signal from the I/O node 604).

After the fuse 602 is blown open, it will have a very high, albeit finite, resistance associated with it. According to one aspect, in its open state the fuse 602 creates a resistance equal to or greater than 1 megaohm between the I/O node 604 and ground. According to another aspects, in its open state the fuse 602 creates a resistance equal to or greater than 10 megaohms. In yet another embodiment, the resistance is equal to or greater than 100 megaohms. These finite resistance values will cause a small amount of leakage current to flow through the fuse 602. However, depending on the supply voltage of the die 402b, this leakage current may be relatively low and range from 1 nA to 1 μA.

Figure 3:
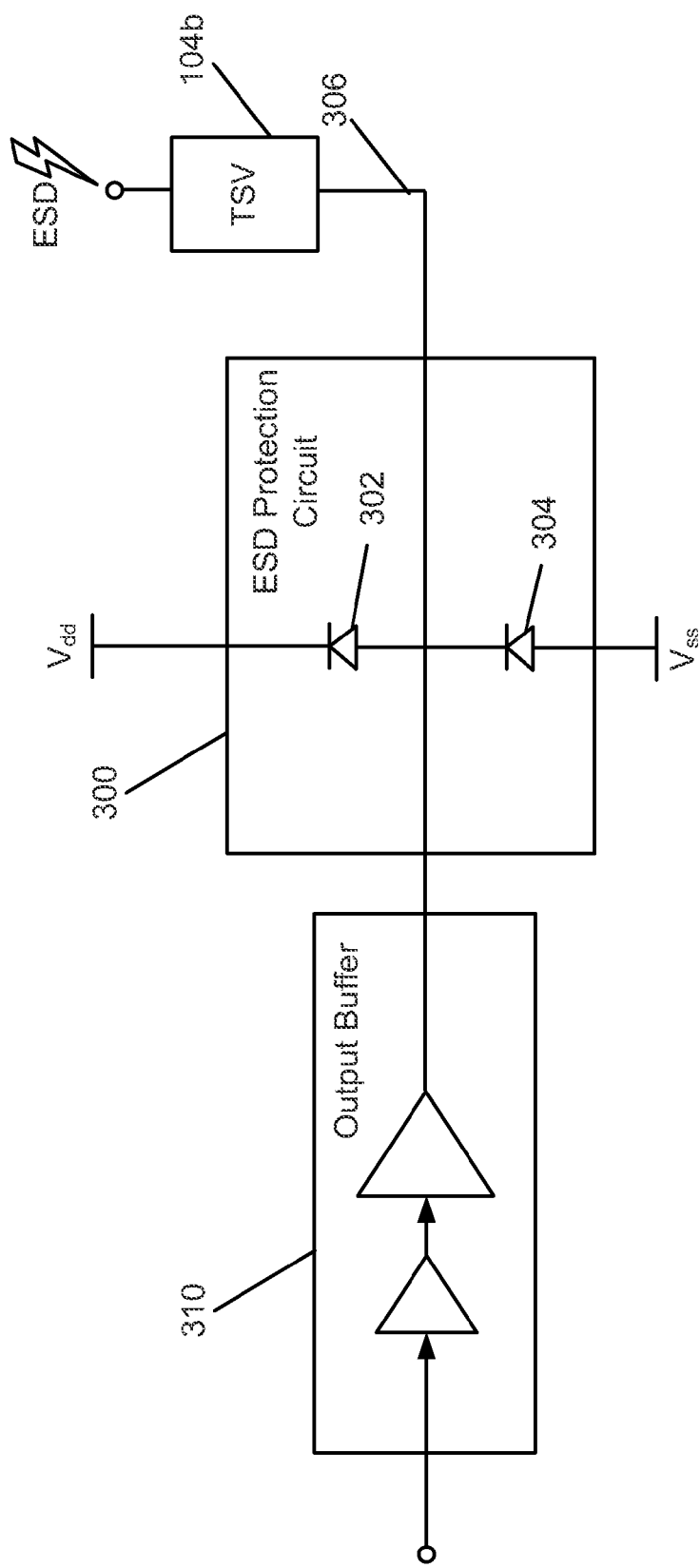
FIG. 3 illustrates a schematic of an electrostatic discharge (ESD) protection circuit found in the prior art that may be coupled to the middle die's through substrate via (TSV) to protect the middle die's circuitry from ESD damage.

Utilizing the ESD protection circuit 600 having the fuse 602 described herein is advantageous because, among other things, it may significantly reduce the active surface area needed to protect the die 402b from ESD as compared with prior art solutions (described with reference to FIG. 3). For example, the fuse 602 may occupy less active surface area on the die 602b than diodes 302, 304 associated with prior art ESD protection circuit 300. Moreover, eliminating the need for large diode 302, 304 based ESD protection circuitry 300 and instead using the ESD protection circuitry 600 described herein may further save active surface area on the die 402b because the I/O buffer circuits 610 coupled to the I/O nodes 604 may themselves be designed smaller. For example, the fuse 602 occupying a smaller area than the diodes 302, 304 may reduce parasitic effects at the I/O node 604, which in turn allows a smaller buffer circuit 610 to drive the I/O node 604.

The ESD protection circuit 600 described above is not limited to use with dies, such as 402b, that are mounted to the package substrate 412 in a flip chip fashion see FIG. 4). Additionally, the ESD protection circuit 600 may be used to protect circuit components of MCM dies that are not coupled to a package substrate in such a flip chip fashion where the active surface of the die points away from the package substrate.

Figure 9:
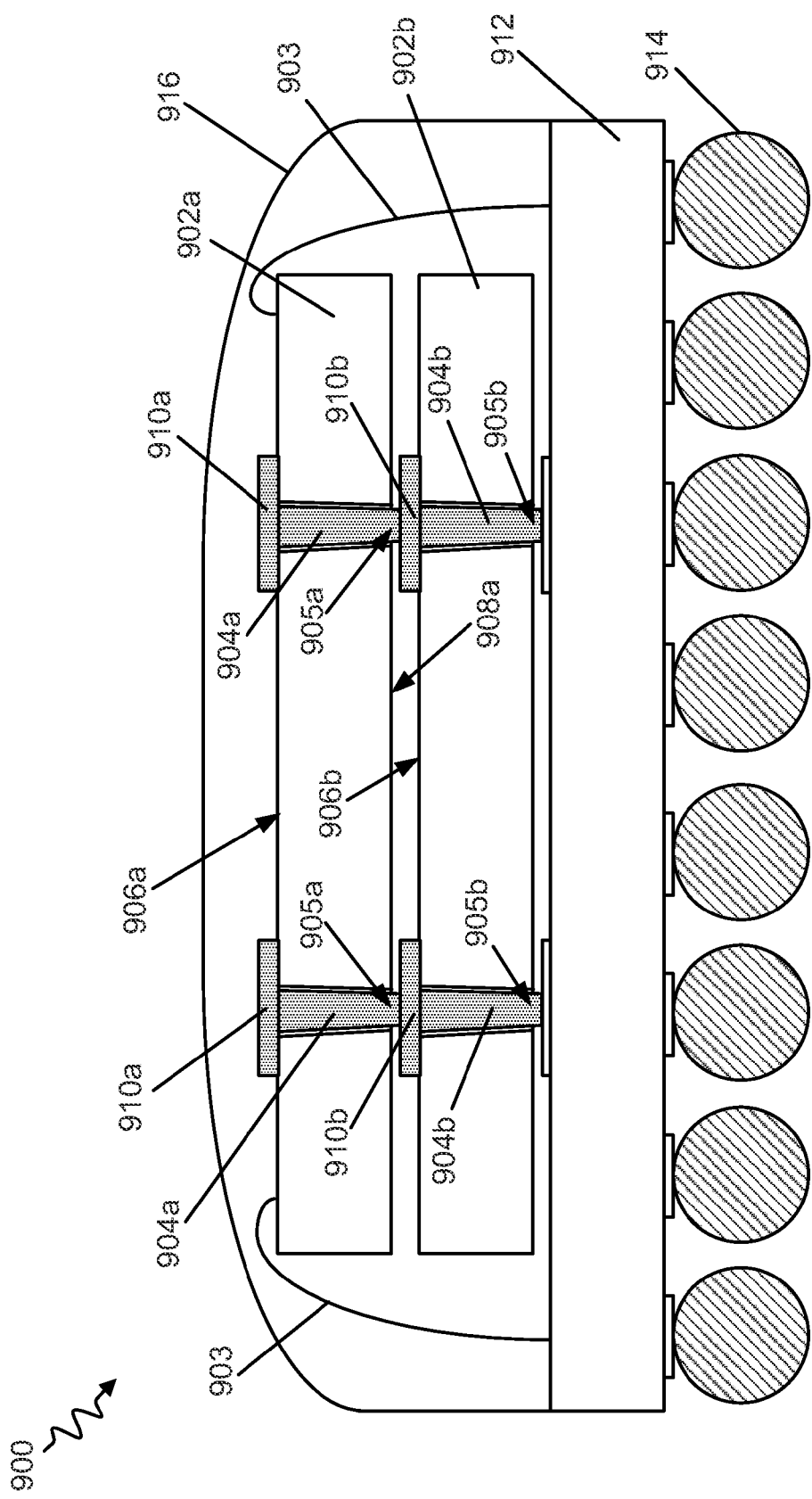
FIG. 9 illustrates an MCM comprising two dies where the first die is wire bonded to the package substrate and the second die is not coupled to the package substrate in a flip chip fashion.

For example, FIG. 9 illustrates an MCM 900 comprising two dies 902a, 902b where the first die 902a is wire bonded 903 to the package substrate 912 and the second die 902b is not coupled to the package substrate 912 in a flip chip fashion. The first die 902 and the second die 902b are both electrically coupled to one another using one or more conductive TSVs 904a, 904b. The first die 902a has an active surface 906a that includes a plurality of integrated circuit components (e.g., transistors, capacitors, inductors, resistors, etc.) that faces away from the package substrate 912, and a back side surface 908a that faces toward the package substrate 912. The TSVs 904a are electrically coupled to the first die's active surface 906a and pass through the thickness of the first die's 902a substrate. Similarly, the second semiconductor die 902b has an active surface 906b and a back side surface 908b. The second die's TSV 904b is electrically coupled to the second die's active surface 906b and passes through the thickness of the second die's 902b substrate. For example, the first die's TSVs 904a may be electrically coupled to input/output nodes associated with the first die 902a, and the second die's TSVs 904b may be electrically coupled to the input/output nodes associated with the second die 902b. These input/output nodes act as input and/or output terminals of the dies 902a, 902b.

The TSVs 904a, 904b have contact pads 910a, 910b at one end and contact pad receivers 905a, 905b at an opposite end. Each dies' active surface 906a, 906b may be electrically coupled to its respective TSVs 904a, 904b. The contact pads 910a, 910b are exposed at the dies' front side active surfaces 906a, 906h, and the contact pad receivers 905a, 905b are exposed at the dies' back side surfaces 908a, 908b.

The first die's contact pad receivers 905a are physically and electrically coupled to the second die's contact pads 910b. In this fashion, the dies' active surfaces 906a, 906b are electrically coupled to one another through the vias 904a, 904b. The second die 902b is physically and electrically coupled to the package substrate 912. For example, the second die 902b may be electrically coupled to the package substrate 912 directly using wire bonds (not shown) and/or indirectly through the first die 902a which is wire bonded 903 to the package substrate 912. The package substrate 912 may include multiple layers having a plurality of interconnections (not shown) there between. The interconnections in turn may be electrically coupled to a plurality of soldering balls 914 that form a ball grid array (BGA) that is used to electrically couple the MCM 900 to a printed circuit board (not shown). The components of the MCM 900, including the dies 902a, 902b, the TSVs 904a, 904b, and at least a portion of the substrate 912 may be encased in a molding compound 916. Although the MCM 900 shown has two dies 902a, 902b, the MCM 900 may have any number of dies equal to or greater than two that are stacked on top of each other and electrically coupled to one another using TSVs having contact pads and contact pad receivers similar to those described above with respect to the first and second dies 902a, 902b.

Figure 10:
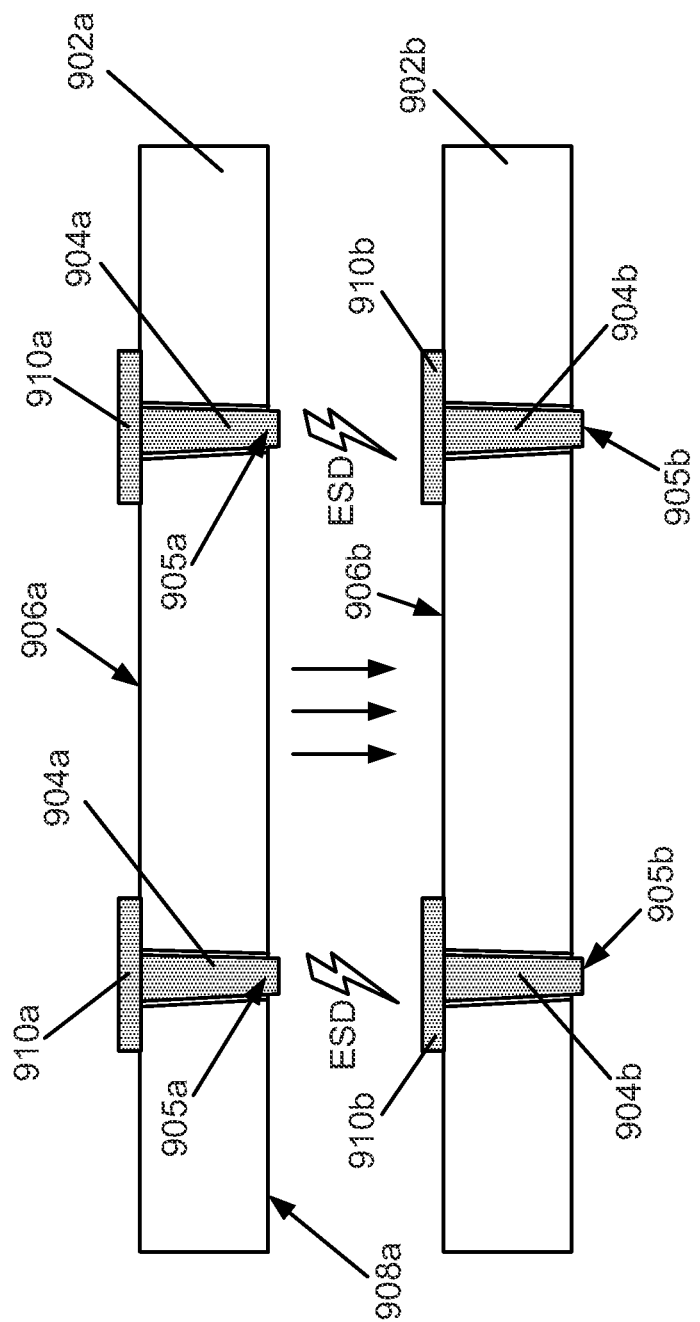
FIG. 10 illustrates the process of electrically and physically coupling the first die to the second die during manufacturing of the MCM.

FIG. 10 illustrates the process of electrically and physically coupling the first die 902a to the second die 902b (see directional arrows) during manufacturing of the MCM 900. (The wire bonds 903, the package substrate 912, the soldering balls 914, and the molding compound 916 have been omitted for clarity.) During this process, the first die 902a is moved closer to the second die 902b, and stacked on top such that the contact pad receivers 905a of the first die 902a physically and electrically couple to the contact pads 910b of the second die 902b. Just like the MCM 400 described above with respect to FIGS. 4 and 5, the first die 902a in FIG. 10 may have an electrostatic potential that is substantially different (e.g., much greater or much less) than the second die 902b, which may be grounded. When the two dies 902a, 902b get sufficiently close (e.g., upon contact), an ESD event may occur and a relatively large amount of current momentarily flows through TSV 904b of the second die 902b.

The ESD circuit 600 may be coupled to I/O nodes associated with the second die's active surface 906b to prevent damage to sensitive circuitry located thereon. Thus, the ESD circuit 600, the modes of operation of its fuse 602, along with techniques of blowing the fuse 602 using the I/O buffer circuit and/or the fuse-blow circuit 710, may all be used with the MCM 900 illustrated in FIGS. 9 and 10 in the same manner described above with respect to FIGS. 6-8.

Figure 11:
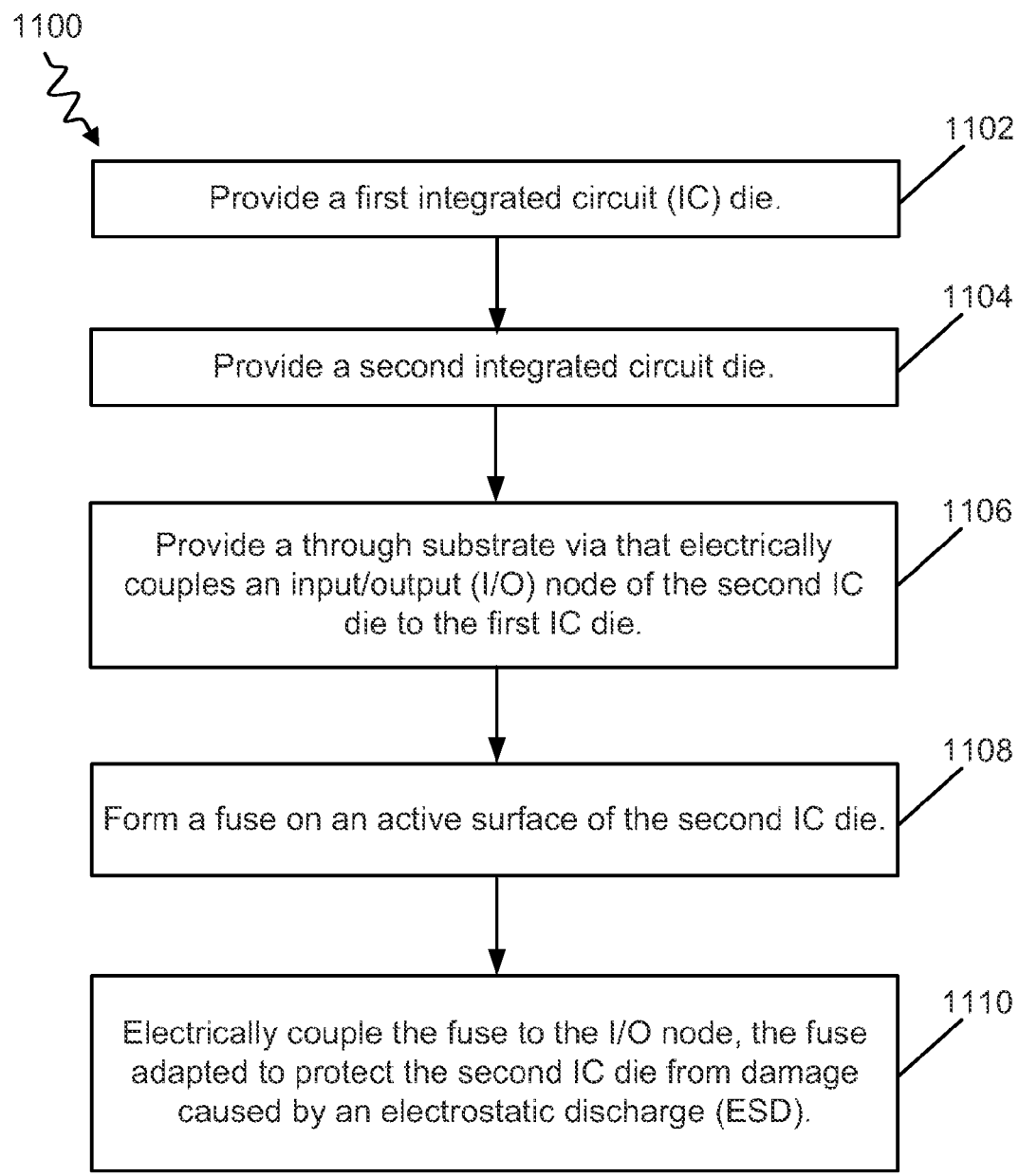
FIG. 11 illustrates a flowchart for a method of manufacturing a multi-chip module.

FIG. 11 illustrates a flowchart 1100 for a method of manufacturing a multi-chip module according to one aspect of the disclosure. At step 1102, a first integrated circuit (IC) die is provided. At step 1104, a second integrated circuit die is provided. In one example, the first and second IC dies may be stacked. At step 1106, a through substrate via (TSV) is provided that electrically couples an input/output (I/O) node of the second. IC die to the first IC die. At step 1108, a fuse is formed on an active surface of the second IC die. At step 1110, the fuse is electrically coupled to the I/O node, and the fuse is adapted to protect the second IC die from damage caused by an electrostatic discharge (ESD).

Figure 12:
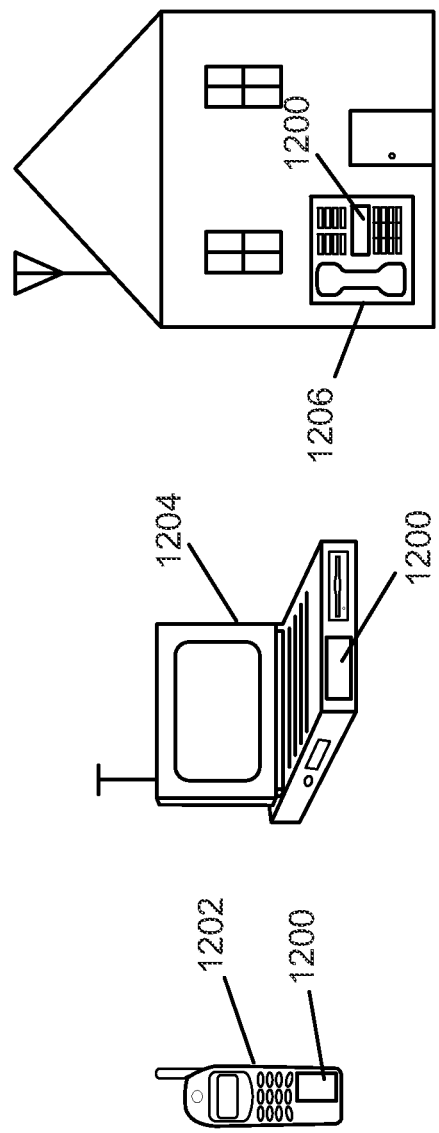
FIG. 12 illustrates various electronic devices that may be integrated with an MCM.

FIG. 12 illustrates various electronic devices that may be integrated with a multi-chip module (MCM) 1200. The MCM 1200 may be any one of the MCMs 400 and/or 900 described above with respect to FIGS. 4 and/or 9. For example, a mobile telephone 1202, a laptop computer 1204, and a fixed location terminal 1206 may include the MCM 1200. The devices 1202, 1204, 1206 illustrated in FIG. 12 are merely exemplary. Other electronic devices may also feature the MCM 1200 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc., The various features of the invention described herein can be implemented in different systems without departing from the invention. It should be noted that the foregoing aspects of the disclosure are merely examples and are not to be construed as limiting, the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A multi-chip module, comprising:
  a first integrated circuit (IC) die;
  a second IC die, in a stacked arrangement relative to the first IC die, having an input/output (I/O) node configured to electrically couple to the first IC die by a through substrate via (TSV) in the second IC die; and
  a fuse on an active surface of the second IC die that is configured to electrically couple to the I/O node,
  wherein
  the fuse is configured to allow an electrostatic discharge (ESD) current surge to go directly to ground and bypass an amplifier circuit of the second die to protect the amplifier circuit from damage caused by the ESD current surge, and
  the amplifier circuit is configured to generate a fuse-blow current to transition the fuse from a closed state to an open state to electrically disconnect the I/O node from ground and provide output signals and/or receive input signals at the I/O node.

2. The multi-chip module of claim 1, wherein the fuse is configured to protect the second IC die from damage caused by the ESD occurring in response to electrically coupling the first IC die to the second IC die.

3. The multi-chip module of claim 1, wherein the fuse includes a first terminal and a second terminal, the first terminal coupled to the I/O node and the second terminal coupled to ground.

4. The multi-chip module of claim 1, wherein the fuse provides a short circuit path from the I/O node to ground if the fuse is in a closed state.

5. The multi-chip module of claim 1, wherein the amplifier circuit comprises an amplifier input terminal and/or an amplifier output terminal, and one of the amplifier output terminal and the amplifier input terminal is configured to electrically couple to the I/O node.

6. The multi-chip module of claim 1, wherein the fuse transitions from the closed state to the open state in response to the fuse-blow current having parameters of 1 milliamp (mA) to 100 mA lasting 50 microseconds (μs) to 200 μs, 5 mA to 100 mA lasting 10 μs to 200 μs, or 10 mA to 100 mA lasting 10 μs to 200 μs.

7. The multi-chip module of claim 1, wherein the fuse remains in a closed state in response to the current surge at the I/O node generated by the ESD, and transitions to an open state in response to the fuse-blow current generated by the amplifier circuit of the second IC die.

8. The multi-chip module of claim 1, wherein the fuse is part of an ESD protection circuit that is free of diodes.

9. The multi-chip module of claim 1, wherein the fuse is a metal fuse or a poly-silicon fuse.

10. The multi-chip module of claim 1, wherein the fuse provides a resistance greater than or equal to ten (10) megaohms between the I/O node and ground if the fuse is in an open state.

11. The multi-chip module of claim 1, wherein the multi-chip module is incorporated into at least one of a music player, a video player, an entertainment unit, a navigation device, a communications device, a mobile phone, a smartphone, a personal digital assistant, a fixed location terminal, a tablet computer, and/or a laptop computer.

12. The multi-chip module of claim 1, wherein an I/O buffer electrically coupled to the I/O node provides the output signals and/or receives the input signals via the I/O node when the fuse is in the open state and the I/O node is electrically disconnected from ground.

13. The multi-chip module of claim 12, wherein if the ESD current surge does not occur when the first IC die is electrically and physically coupled to the second IC die and the fuse remains in the closed state, the I/O buffer generates a current flow that transitions the fuse from the closed state to the open state.

14. A method of manufacturing a multi-chip module, the method comprising:
  providing a first integrated circuit (IC) die;
  providing a second integrated circuit die in a stacked arrangement relative to the first IC die;
  providing a through substrate via (TSV) in the second IC die, and providing an electrical path, via the TSV, from an input/output (I/O) node of the second IC die to the first IC die;
  forming a fuse on an active surface of the second IC die; and
  wherein the fuse is electrically coupled to the I/O node, and allows an electrostatic discharge (ESD) current surge to go directly to ground and bypass an amplifier circuit of the second die to protect the amplifier circuit from damage caused by the ESD current surge, and
  wherein the amplifier circuit is configured to generate a fuse-blow current to transition the fuse from a closed state to an open state to electrically disconnect the I/O node from ground and provide output signals and/or receive input signals at the I/O node.

15. The method of claim 14, wherein the fuse protects the second IC die from damage caused by the ESD occurring in response to electrically coupling the first IC die to the second IC die.

16. The method of claim 14, further comprising:
  coupling a first terminal of the fuse to the I/O node; and
  coupling a second terminal of the fuse to ground.

17. The method of claim 14, further comprising:
  providing a short circuit path from the I/O node to ground by while the fuse is in a closed state.

18. The method of claim 14, wherein the amplifier circuit comprises an amplifier output terminal and/or an amplifier input terminal, and one or the amplifier output terminal and the amplifier input terminal is electrically coupled to the I/O node.

19. The method of claim 14, wherein the fuse-blow current has parameters of 1 milliamp (mA) to 100 mA lasting 50 microseconds (μs) to 200 μs, 5 mA to 100 mA lasting 10 μs to 200 μs, or 10 mA to 100 mA lasting 10 μs to 200 μs.

20. The method of claim 14, wherein:
  the fuse is in a closed state in response to a current surge at the I/O node generated by the ESD; and
  is in an open state in response to a fuse-blow current generated by amplifier circuit of the second IC die.

21. The method of claim 14, wherein the multi-chip module is incorporated into at least one of a music player, a video player, an entertainment unit, a navigation device, a communications device, a mobile phone, a smartphone, a personal digital assistant, a fixed location terminal, a tablet computer, and/or a laptop computer.

22. The method of claim 14, wherein an I/O buffer electrically coupled to the I/O node provides the output signals and/or receives the input signals via the I/O node when the fuse is in the open state and the I/O node is electrically disconnected from ground.

23. The method of claim 22, wherein if the ESD current surge does not occur when the first IC die is electrically and physically coupled to the second IC die and the fuse remains in the closed state, the I/O buffer generates a current flow that transitions the fuse from the closed state to the open state.

24. A multi-chip module, comprising:
a first integrated circuit (IC) die;
a second IC die, in a stacked arrangement relative to the first IC die, having an input/output (I/O) node;
means for configuring the I/O node of the second IC die to electrically couple to the first IC die; and
means for protecting an amplifier circuit of the second IC die from damage caused by an electrostatic discharge (ESD) current surge by allowing the ESD current surge to go directly to ground and bypass the amplifier circuit, the means for protecting located on an active surface of the second IC die, and
wherein the amplifier circuit is configured to generate a fuse-blow current to transition the means for protecting from an enabled state to a disabled state to electrically disconnect the I/O node from ground and provide output signals and/or receive input signals at the I/O node.

25. The multi-chip module of claim 24, wherein the means for protecting is configured to protect the amplifier circuit of the second IC die from damage caused by the ESD occurring in response to electrically coupling the first IC die to the second IC die.

26. The multi-chip module of claim 24, wherein the means for protecting the amplifier circuit of the second IC die is a fuse having a first terminal and a second terminal, and the first terminal is coupled to the I/O node and the second terminal is coupled to ground.

27. The multi-chip module of claim 26, wherein the fuse provides a short circuit path from the I/O node to ground if the fuse is in a closed state.

28. The multi-chip module of claim 26, wherein the fuse remains in a closed state in response to a current surge at the I/O node generated by the ESD, and transitions to an open state in response to a fuse-blow current generated by the amplifier circuit.

29. The multi-chip module of claim 24, wherein an I/O buffer electrically coupled to the I/O node provides the output signals and/or receives the input signals via the I/O node when the fuse is in the open state and the I/O node is electrically disconnected from ground.

30. The multi-chip module of claim 29, wherein if the ESD current surge does not occur when the first IC die is electrically and physically coupled to the second IC die and the fuse remains in the closed state, the I/O buffer generates a current flow that transitions the fuse from the closed state to the open state.

* * * * *